(12) United States Patent
Sheen

(10) Patent No.: US 11,184,005 B2
(45) Date of Patent: Nov. 23, 2021

(54) SEMICONDUCTOR FIELD PROGRAMMABLE DEVICE

(71) Applicant: Ben Sheen, Saratoga, CA (US)

(72) Inventor: Ben Sheen, Saratoga, CA (US)

(*) Notice: Subject to any disclaimer, the term of this patent is extended or adjusted under 35 U.S.C. 154(b) by 0 days.

(21) Appl. No.: 17/037,522

(22) Filed: Sep. 29, 2020

(65) Prior Publication Data

US 2021/0105015 A1 Apr. 8, 2021

Related U.S. Application Data

(60) Provisional application No. 62/911,278, filed on Oct. 6, 2019.

(51) Int. Cl.
*H03K 19/173* (2006.01)
*H03K 19/17736* (2020.01)
*H03K 19/1776* (2020.01)

(52) U.S. Cl.
CPC ..... *H03K 19/1733* (2013.01); *H03K 19/1774* (2013.01); *H03K 19/1776* (2013.01)

(58) Field of Classification Search
None
See application file for complete search history.

(56) References Cited

U.S. PATENT DOCUMENTS

| 4,871,930 | A | 10/1989 | Wong et al. | |
|---|---|---|---|---|
| 5,572,148 | A | 11/1996 | Lytle et al. | |
| 5,942,913 | A | 8/1999 | Young et al. | |
| 7,149,316 | B1* | 12/2006 | Kutz | H03F 3/72 381/120 |
| 8,487,655 | B1* | 7/2013 | Kutz | G01R 31/3177 326/86 |
| 2002/0108006 | A1* | 8/2002 | Snyder | G11C 16/10 710/100 |
| 2017/0286344 | A1* | 10/2017 | Sullam | G06F 13/4022 |

OTHER PUBLICATIONS

S. Chakrabartty et al., "Sub-Microwatt Analog VLSI Trainable Pattern Classifier", IEEE Journal of Solid-State Circuits, vol. 42, No. 5, May 2007, pp. 1169-1179.

* cited by examiner

*Primary Examiner* — Jany Richardson

(57) ABSTRACT

A field programmable device or software-defined hardware can change its functions by using software codes to alter the routing path of interconnect signal lines or the electrical properties of fundamental building elements. The field programmable device includes I/O interface blocks and signal processing blocks comprising analog signal processing units, digital signal processing units, memory units, clock units, and other supporting functional units which are electrically connected by user programmable interconnect signal lines. The analog signal processing functions can be altered by changing the electrical properties of fundamental building elements as well as the programmable signal lines after the device is manufactured.

20 Claims, 5 Drawing Sheets

SEMICONDUCTOR FIELD PROGRAMMABLE DEVICE

This application claims the benefit of U.S. Provisional Application No. 62/911,278 filed on Oct. 6, 2019.

BACKGROUND

The technical field is related to semiconductor field programmable devices, e.g., field programmable gate array (FPGA), field programmable analog array (FPAA), or programmable logic device (PLD).

SUMMARY OF THE INVENTION

Embodiments may overcome disadvantages of conventional field programmable logic gate array devices.

Embodiments may be related to a semiconductor field programmable device which has programmable analog mixed signal modules with user software-configured signal routings to define the device hardware function. A block diagram example for the mixed signal field programmable device is shown in FIG. 1.

DETAILED DESCRIPTION OF EXAMPLE EMBODIMENTS

Figure 2:
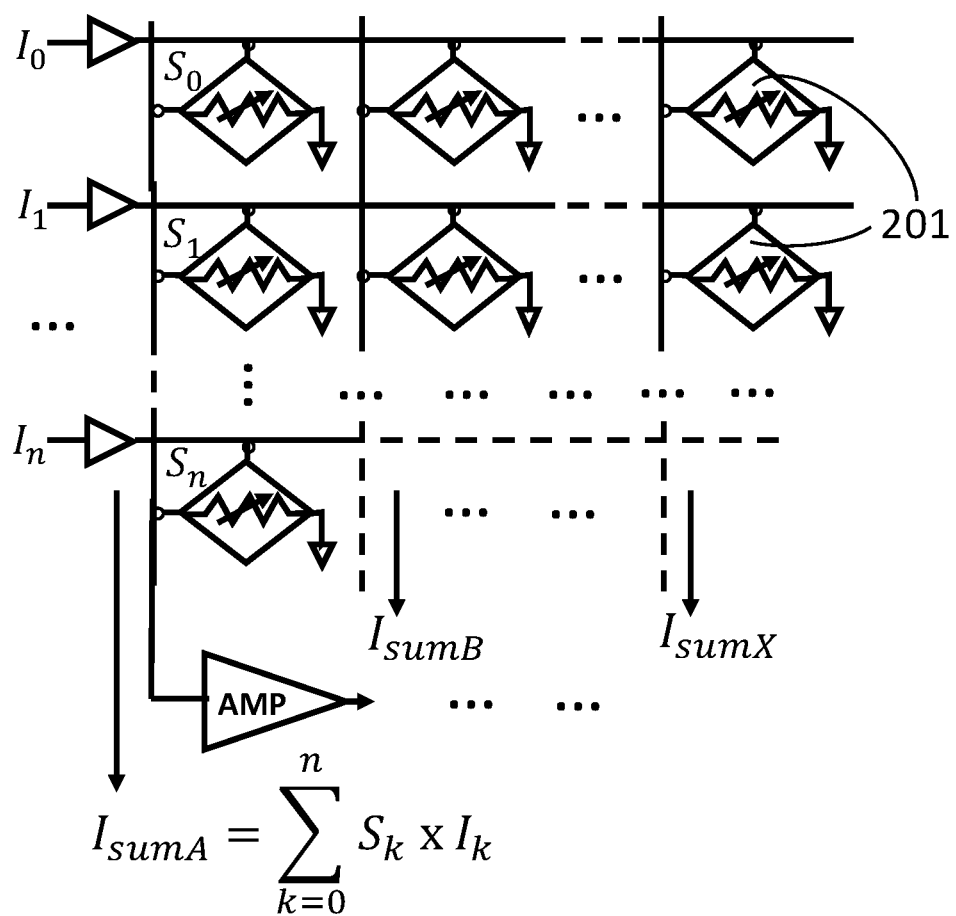
FIG. 2 illustrates an example of Analog Signal Processing (ASP).

Analog Signal Processing (ASP) in integrated circuit uses semiconductor device physics based computational primitives in analog domain instead of digital logic gates to compute the results in order to achieve high integration and low energy consumption which are superior to equivalent digital implementation. An example of schematic for ASP using an array of the same building element 201 is shown in FIG. 2. Each semiconductor device element 201 in the array can have different application-dependent characteristics implemented by the designers or users of the ASP circuit blocks to represent various parameters in signal processing calculations. For example, the device can have different resistance values which can be used as multiple digital bit weights in neural network (NN) models for artificial intelligent (AI) computation. Referring to FIG. 2, the conducting strength ($S_k$) of semiconductor device element 201 can be altered or programmed electrically to different values which represent different current driving capability or strength of the elements in the array, and the output of element 201 is proportional to the multiplication of input stimulus ($I_k$) and its strength ($S_k$). By applying different signal strength on the inputs of array, the output of a column, e.g. $I_{sumA}$, is the cumulative output value of each array element connected on the same column. This multiply-accumulate operation of analog signal processing is mainly performed using analog circuits and analog characteristics of the elements to compute and obtain results in analog values which are converted to digital bit representations for use in the systems.

Figure 3A:
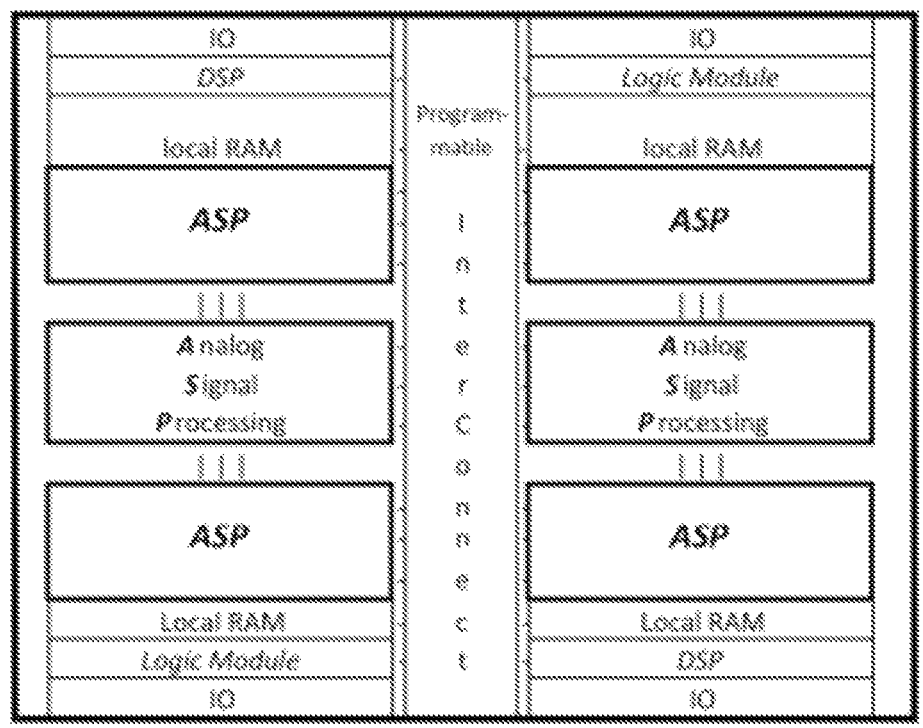
FIG. 3A illustrates a uniform symmetric AMSP building block unit tile.

Analog signal processing has better power, speed and implemented physical size area advantages than digital signal processing (DSP) based circuits. FIG. 3A shows ASP circuit blocks, logic modules, DSP blocks, local random access memories (RAM's), local inputs and outputs (I/O's) and inter-block programmable interconnect signal routings forming an example of analog and digital mixed signal processing (AMSP) building block unit tile. The logic modules can be user programmable to implement certain computations which is suitable to operate in digital domain. The interconnect routings contain programmable control switch circuits to configure the signal paths between blocks by users' software codes after the programmable hardware devices are manufactured. The interconnect signal lines can route either digital or analog signals, and each signal line can have the additional capability to be configured as analog signal line or digital signal line by users in the field after the programmable devices deployed in systems. The AMSP block can function alone as an embedded circuit block in a custom designed application specific IC's through its local I/O (or IO) interfaces, or be used to build a general purpose standalone semiconductor programmable device.

The dimensions of different ASP blocks in AMSP tiles are the same in FIG. 3A, and higher capacity semiconductor programmable chips can be assembled by tiling an array of AMSP together with other different peripheral circuit blocks and I/O interfaces for a variety of functions and system applications. An example of such field programmable analog mixed signal array integrated circuit with embedded processor cores (e.g., ARM, RISC-V, etc.), level 2 (L2) RAM outside of AMSP blocks, external memory interface, PCIe I/O, clock circuitry, embedded non-volatile flash memory and security function blocks is shown in FIG. 1.

Programmable interconnects have global signal routing lines across multiple tiles or whole length or width of the device. For example, the across-device global programmable interconnect routing (GPICr) signal lines can be placed vertically and horizontally in the middle and half of the chip, and connect AMSP tiles with peripheral blocks like L2 RAM, processor cores and other peripheral circuits. These user programmable routings are hierarchical, and inter-tile routings are mainly to connect individual tiles for configuring the complete device functions.

Figure 3B:
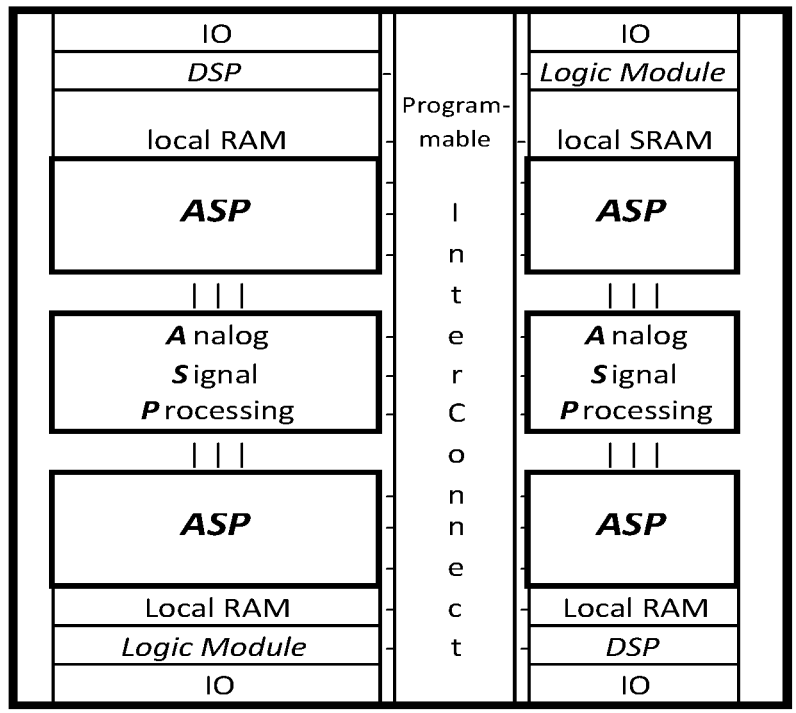
FIG. 3B illustrates an asymmetric variable depth AMSP building block unit tile.
Figure 3C:
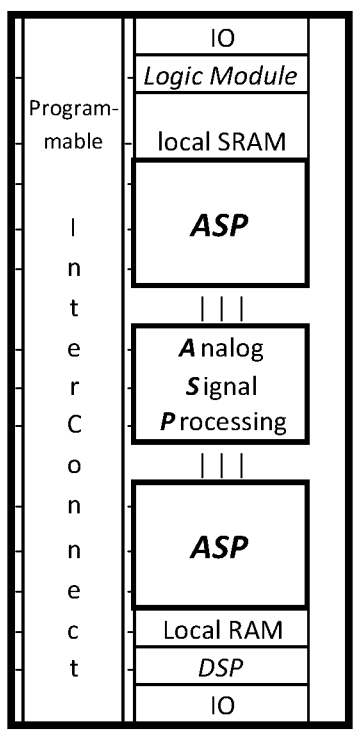
FIG. 3C illustrates an alternate example of AMSP building block unit tile.

FIG. 3B shows an asymmetric variable depth AMSP building block unit tile which contains ASP, DSP, programmable logic module blocks with different density, capacity or depth. This user software-defined programmable hardware device with non-uniform blocks can have better logic gate, ASP block utilization and efficient signal routing with reduced active signal line congestion for specific configured device functions or applications, including certain customized neural network models for AI computing. An alternate example of AMSP building block unit tile is shown in FIG. 3C.

Figure 1:
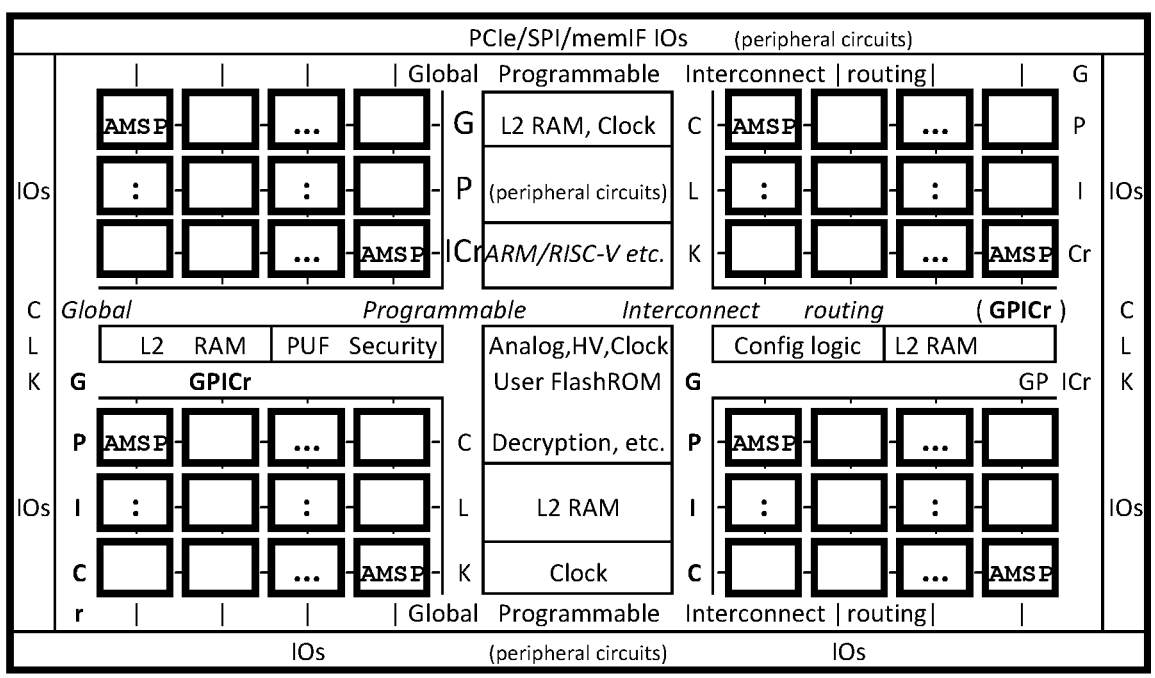
FIG. 1 illustrates an example of user software defined semiconductor analog mixed signal field programmable device.
Figure 4:
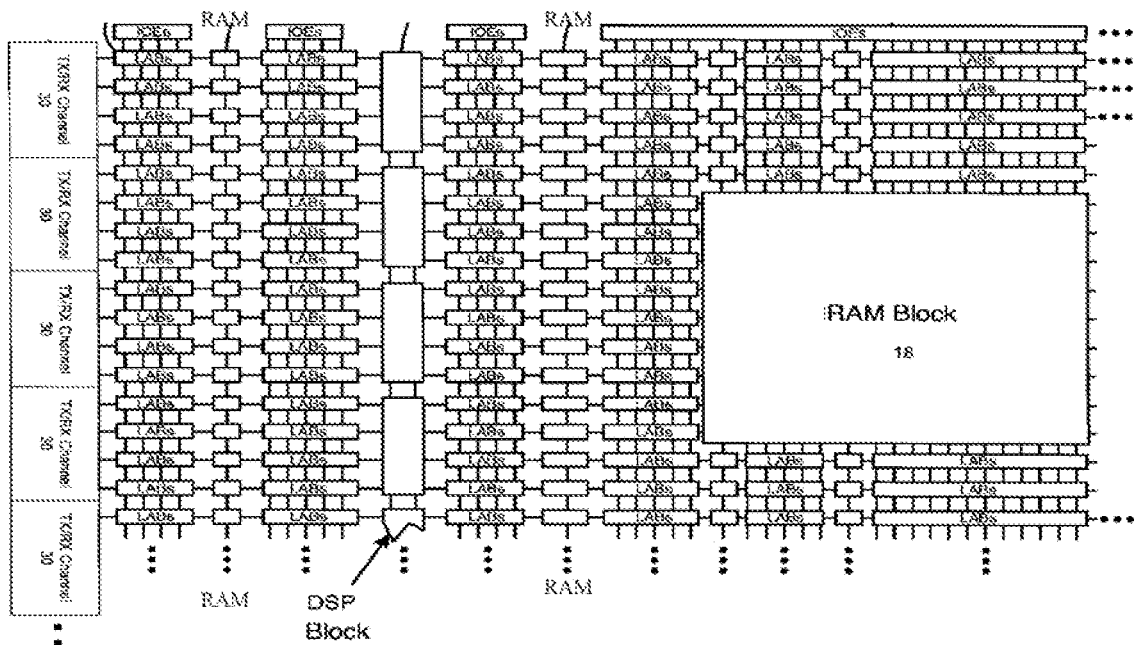
FIG. 4 illustrates a prior art FPGA block diagram.

Referring to FIG. 1, the AMSP array in the field programmable device can be variants of the AMSP building blocks. Examples of different AMSP are shown in FIG. 3A, FIG. 3B, and FIG. 3C. A conventional digital logic based FPGA chip architecture prior art with logic array block (LAB), DSP, RAM and TX/RX I/O's is shown in FIG. 4.

Figure 5:
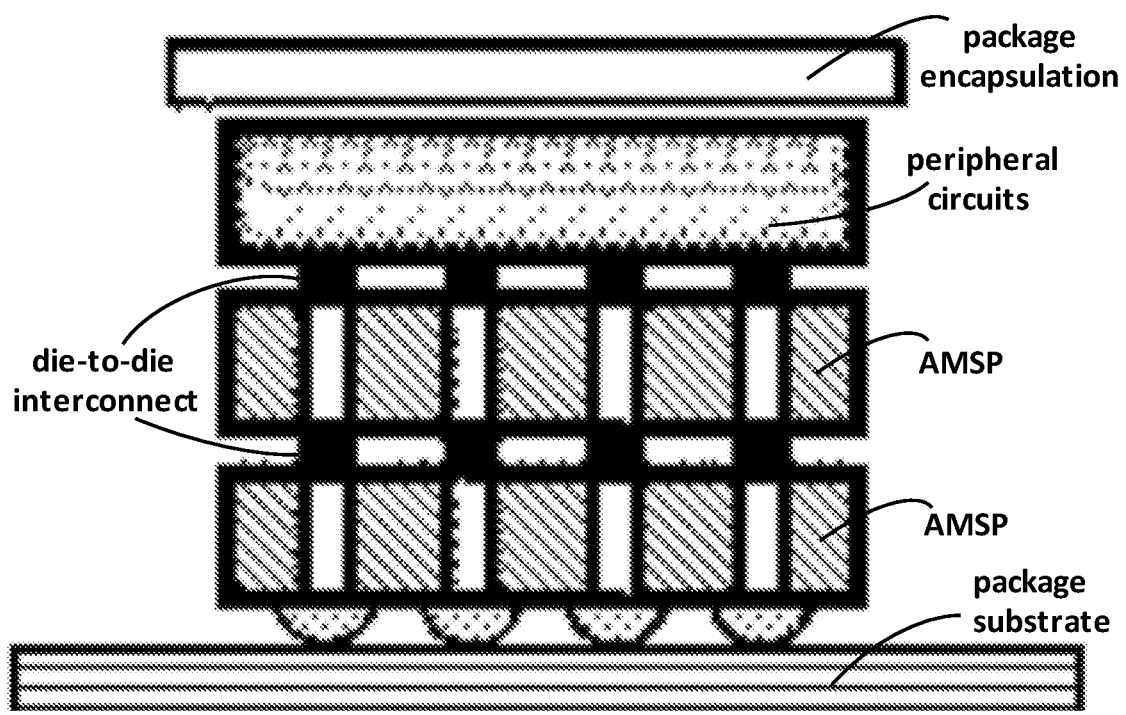
FIG. 5 illustrates an alternate integration of analog mixed signal field programmable device shown in FIG. 1 by using 3D stacked die packaging.

Scaling the programmable devices to different capacities can be done by tiling different number of AMSP blocks side by side together monolithically with peripheral circuit blocks. Stacking multiple AMSP block dies vertically and bonding them together using the signal line connections of local I/O's designed as direct bonding pads can also obtain different capacities of the programmable devices by 3D stacked die packaging technology. An example of the cross section view of the 3D analog mixed signal field programmable device is shown in FIG. 5, and the position of peripheral circuit die or dies can be at the bottom, middle, or top of the die stack. The monolithic 2D planar analog mixed signal field programmable device itself is also capable to have micro bonding pads to stack on top of other field programmable devices to scale up the packaged product capacity.

What is claimed is:

1. A signal processing device, comprising:
a programmable interconnect unit;
a first digital signal processing unit electrically connected to the programmable interconnect unit;
a first memory unit electrically connected to the programmable interconnect unit;
a first analog signal processing unit electrically connected to the programmable interconnect unit and comprising analog computation semiconductor elements; and
a first interface unit electrically connected to at least one of the first digital signal processing unit and the first analog signal processing unit.

2. The signal processing device of claim 1, further comprising: a second analog signal processing unit electrically connected to the programmable interconnect unit.

3. The signal processing device of claim 2, wherein the second analog signal processing unit is electrically connected through the programmable interconnect unit to the first analog signal processing unit.

4. The signal processing device of claim 2, wherein the first analog signal processing unit is larger than the second analog signal processing unit.

5. The signal processing device of claim 2, wherein the first analog signal processing unit is wider than the second analog signal processing unit in a first direction.

6. The signal processing device of claim 5, wherein the first direction is perpendicular to a lengthwise direction or the longer side of the signal processing device.

7. The signal processing device of claim 5, wherein an edge of the first analog signal processing unit is aligned with an edge of the second analog signal processing unit in the first direction.

8. The signal processing device of claim 1, wherein the programmable interconnect unit is positioned between the first analog signal processing unit and the first digital signal processing unit.

9. The signal processing device of claim 1, wherein a total quantity of analog signal processing units in the signal processing device is greater than a total quantity of digital signal processing units in the signal processing device.

10. The signal processing device of claim 1, wherein outputs of the signal processing device depend on programmed conducting strengths of the analog computation semiconductor elements.

11. A signal processing device, comprising:
a programmable interconnect unit;
a first digital signal processing unit electrically connected to the programmable interconnect unit;
a first memory unit electrically connected to the programmable interconnect unit;
a first analog signal processing unit electrically connected to the programmable interconnect unit; and
a first interface unit electrically connected to at least one of the first digital signal processing unit and the first analog signal processing unit, wherein the first interface unit is electrically connected through the digital signal processing unit to the analog signal processing unit.

12. A field programmable device, comprising:
a first signal processing block comprising a first programmable interconnect unit, a first digital signal processing unit electrically connected to the first programmable interconnect unit, a first memory unit electrically connected to the first programmable interconnect unit, a first analog signal processing unit electrically connected to the first programmable interconnect unit, and a first interface unit electrically connected to at least one of the first digital signal processing unit and the first analog signal processing unit;
a peripheral function unit electrically connected to the first signal processing block through the first programmable interconnect unit;
a clock unit electrically connected to the first signal processing block; and
a second signal processing block electrically connected to the clock unit and comprising a second programmable interconnect unit, a second digital signal processing unit electrically connected to the second programmable interconnect unit, and a second analog signal processing unit electrically connected to the second programmable interconnect unit.

13. The field programmable device of claim 12, wherein the first and the second signal processing blocks are electrically connected by the first and the second programmable interconnect units.

14. The field programmable device of claim 12, wherein the first analog signal processing unit is larger than the second analog signal processing unit.

15. The field programmable device of claim 12, wherein the first analog signal processing unit is wider than the second analog signal processing unit in a first direction.

16. The field programmable device of claim 12, wherein the first direction is perpendicular to a lengthwise direction or the longer side of the first signal processing block.

17. The signal processing device of claim 12, wherein a total quantity of analog signal processing units in the first signal processing block is greater than a total quantity of analog signal processing units in the second signal processing block.

18. The signal processing device of claim 12, wherein a total quantity of digital signal processing units in the first signal processing block is less than a total quantity of digital signal processing units in the second signal processing block.

19. The signal processing device of claim 12, further comprising: a separated connection line directly connected to each of the first signal processing block and the second signal processing block.

20. The signal processing device of claim 19, wherein a maximum signal transmission speed of the separated connection line is greater than a maximum signal transmission speed of the first interconnect unit.

* * * * *